(12) United States Patent
Lee (10) Patent No.: US 7,539,064 B2
(45) Date of Patent: May 26, 2009

(54) PRECHARGE CIRCUIT OF SEMICONDUCTOR MEMORY APPARATUS

(75) Inventor: Jong Chern Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 129 days.

(21) Appl. No.: 11/641,857

(22) Filed: Dec. 20, 2006

(65) Prior Publication Data
US 2007/0263465 A1 Nov. 15, 2007

(30) Foreign Application Priority Data
May 10, 2006 (KR) ...................... 10-2006-0041788

(51) Int. Cl.
*G11C 11/34* (2006.01)
(52) U.S. Cl. .............................. 365/185.24; 365/189.06
(58) Field of Classification Search ............ 365/185.24, 365/189.06
See application file for complete search history.

(56) References Cited

U.S. PATENT DOCUMENTS

| | | | |
|---|---|---|---|
| 6,788,569 B2 * | 9/2004 | Tanizaki et al. ............. | 365/171 |
| 6,901,016 B2 * | 5/2005 | Miyashita et al. ........... | 365/203 |
| 2006/0092686 A1 | 5/2006 | Kang | |
| 2006/0092730 A1 | 5/2006 | Kang et al. | |
| 2007/0280018 A1 * | 12/2007 | Lee et al. ..................... | 365/203 |

FOREIGN PATENT DOCUMENTS

| | | |
|---|---|---|
| KR | 1019980005006 | 3/1998 |
| KR | 1020040050534 | 6/2004 |

* cited by examiner

*Primary Examiner*—Tuan T. Nguyen
(74) *Attorney, Agent, or Firm*—Venable LLP; Jeffri A. Kaminski

(57) ABSTRACT

A precharge circuit of a semiconductor memory apparatus includes a first precharge unit and a second precharge unit. The first precharge unit applies a first core voltage to a pair of local input/output lines, in response to a first precharge signal, to precharge the pair of local input/output lines. The second precharge unit applies a clamp voltage, which is generated using a first supply voltage, to the pair of local input/output lines, in response to the first precharge signal, to precharge the pair of local input/output lines.

33 Claims, 4 Drawing Sheets

PRECHARGE CIRCUIT OF SEMICONDUCTOR MEMORY APPARATUS

BACKGROUND OF THE INVENTION

1. Technical Field

The present invention relates to a precharge circuit of a semiconductor memory apparatus, and more particularly, to a precharge circuit of a semiconductor memory apparatus that precharges a pair of local input/output lines LIO and LIOb.

2. Related Art

A conventional precharge circuit of a semiconductor memory apparatus will now be described with reference to FIGS. 1 to 3.

Figure 1:
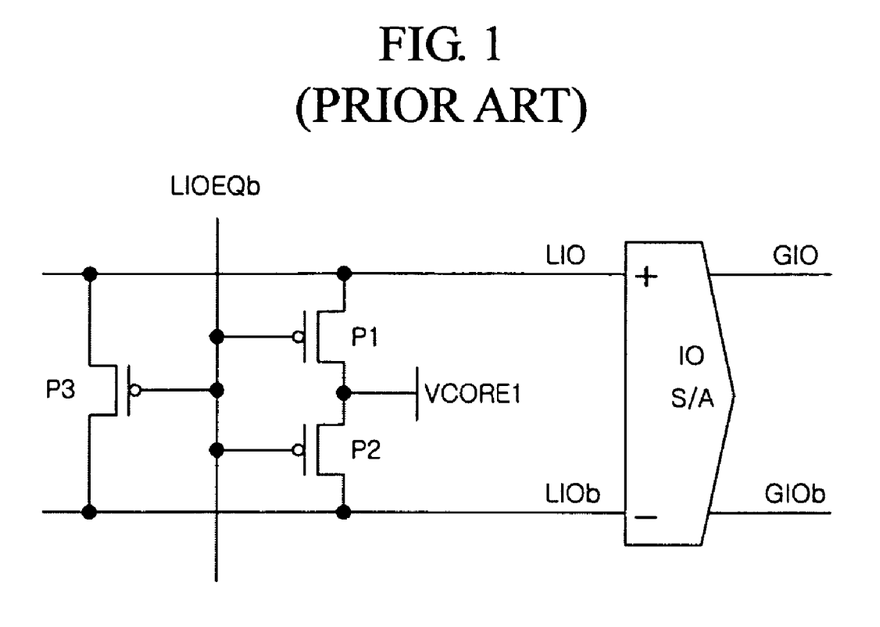
FIG. 1 is a circuit diagram of a conventional precharge circuit for a semiconductor memory apparatus.

FIG. 1 is a circuit diagram of a conventional precharge circuit of a semiconductor memory apparatus.

The conventional precharge circuit of a semiconductor memory apparatus includes a first PMOS transistor P1, a second PMOS transistor P2 and a third PMOS transistor P3.

The first PMOS transistor P1 and a second PMOS transistor P2 precharge a pair of local input/output lines LIO and LIOb to a core voltage VCORE1 in response to a precharge signal LIOEQb.

The third PMOS transistor P3 equalizes the pair of local input/output lines LIO and LIOb in response to the precharge signal LIOEQb.

The pair of local input/output lines LIO and LIOb comprise of a local input/output line LIO and an inverted local input/output line LIOb that has an inverted level with respect to the level of the local input/output line LIO.

As shown in FIG. 1, the first PMOS transistor P1 receives the precharge signal LIOEQb at its gate terminal and its source and drain terminals are coupled between the local input/output line LIO and an input terminal of the core voltage VCORE1.

The second PMOS transistor P2 is connected to the precharge signal LIOEQb at its gate terminal and its source and drain terminals are coupled between the input terminal of the core voltage VCORE1 and the inverted local input/output line LIOb.

The third PMOS transistor P3 is connected to the precharge signal LIOEQb at its gate terminal and its source and drain terminals are coupled between the local input/output lines LIO and the inverted local input/output line LIOb.

The core voltage VCORE1 is an internal voltage having a target level of a core voltage VCORE1, which is generated from an external supply voltage VDD by comparing a divided voltage level of the external supply voltage VDD with a reference voltage VREF1. The core voltage VCORE1 is used to precharge the pair of local input/output lines LIO and LIOb.

The pair of local input/output lines LIO and LIOb are coupled to a pair of global data lines GIO and GIOb through an input/output sense amplifier (hereinafter, referred to as an IO S/A) and are used to input/output data in a bank region of a semiconductor memory apparatus.

Figure 2:
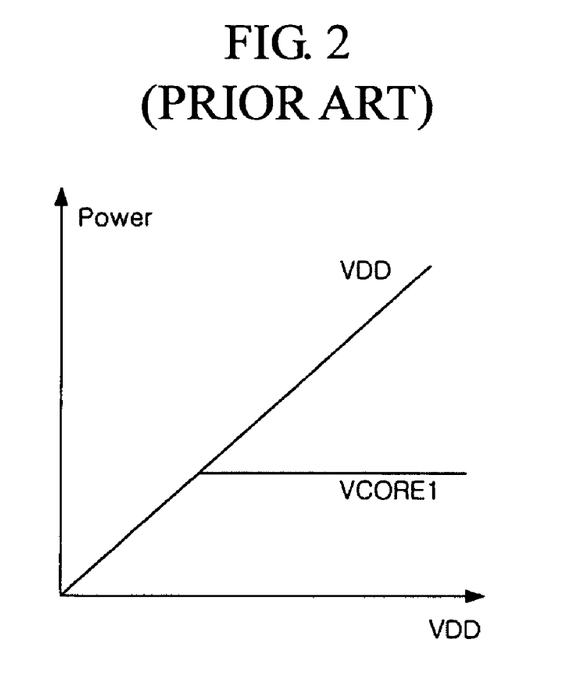
FIG. 2 is a waveform chart illustrating a conventional core voltage.

FIG. 2 is a waveform chart illustrating a conventional core voltage.

As shown in FIG. 2, even though the external supply voltage VDD rises, the core voltage VCORE1 is held at a constant level (a target level of the core voltage VCORE1).

The conventional precharge circuit of a semiconductor memory apparatus will now be described with reference to FIGS. 1 and 2.

When the precharge signal LIOEQb is enabled at a logic low level, the first to third PMOS transistor P1, P2 and P3 are turned on. The first PMOS transistor P1 and the second PMOS transistor P2 precharge the pair of local input/output lines LIO and LIOb to the level of the core voltage VCORE1 and the third PMOS transistor P3 equalizes the pair of local input/output lines LIO and LIOb.

Meanwhile, when the precharge signal LIOEQb is disabled at a logic high level, the first to third PMOS transistors P1, P2, and P3 are turned off and thus the precharged local input/output line LIO and inverted local input/output line LIOb are set to different logic levels based on the logic level of the input/output data. This causes the semiconductor memory apparatus to perform a read operation and a write operation.

When the read operation and the write operation are completed, the precharge signal LIOEQb is once again enabled at a logic low level and the first to third PMOS transistors P1, P2, and P3 are turned on, causing the pair of local input/output lines LIO and LIOb to be precharged to the level of the core voltage VCORE1.

Figure 3:
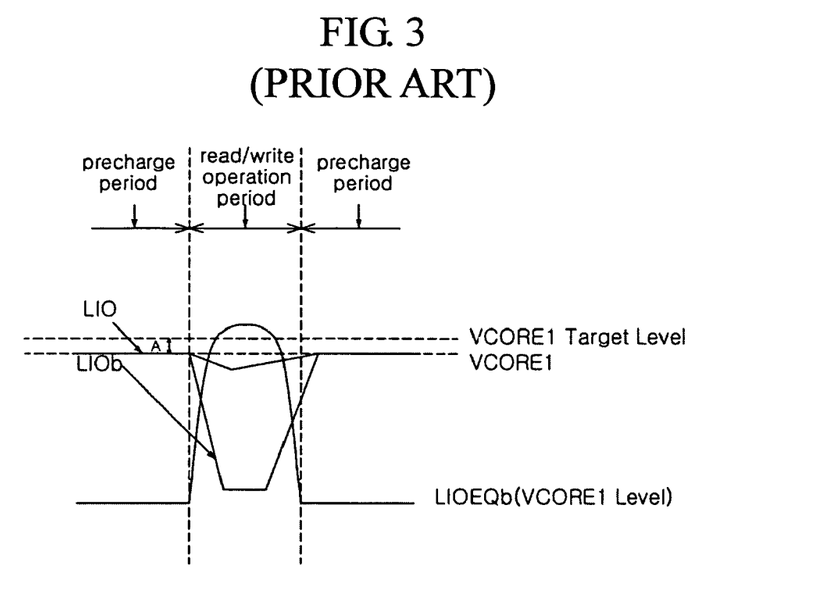
FIG. 3 is a waveform chart illustrating the operation of the precharge circuit shown in FIG. 1.

FIG. 3 is a waveform chart illustrating the operation of the precharge circuit shown in FIG. 1.

When the precharge signal LIOEQb at the level of the core voltage VCORE1 is activated at a logic low level, the core voltage VCORE1 is applied to the pair of local input/output lines LIO and LIOb such that the pair of local input/output lines LIO and LIOb are precharged. When the precharge signal LIOEQb is disabled at a logic high level, the semiconductor memory apparatus performs a read operation and a write operation and the local input/output lines LIO and LIOb are set to different logic levels. When the read operation and the write operation are completed, the precharge signal LIOEQb is activated at a logic low level, causing the pair of local input/output lines LIO and LIOb to precharge to the level of the core voltage VCORE1.

Typically, the core voltage VCORE1 should be applied to the precharge circuit to precharge the pair of local input/output lines LIO and LIOb to the level of the core voltage VCORE1. However, when a plurality of pairs of local input/output lines LIO and LIOb are precharged simultaneously, the core voltage VCORE1 drops. Accordingly, the pairs of local input/output lines LIO and LIOb are precharged to a level lower than the level of the core voltage VCORE1. The difference between the precharge level of the pairs of local input/output lines LIO and LIOb and the level of the core voltage VCORE1 is 'A', as depicted in FIG. 3.

In many semiconductor memory apparatuses, a plurality of pairs of local input/output lines LIO and LIOb are precharged simultaneously, thus consuming a large amount of current. A conventional precharge circuit of the semiconductor memory apparatuses, however, is unable to supply a sufficiently large amount of current to the plurality of the pairs of local input/output lines LIO and LIOb, since the internally generated core voltage VCORE1 is not responsive enough to simultaneously supply such large amount of current. As a result, the core voltage VCORE1 drops.

When the core voltage VCORE1 drops, circuits using the core voltage VCORE1 in the semiconductor memory apparatus operate unstably.

Further, when the core voltage VCORE1 drops, the precharge level is also lowered, causing deterioration in the performance of the sense amplifier S/A, which is designed to operate in a state wherein the pairs of local input/output lines LIO and LIOb are fully precharged to the level of the core voltage VCORE1.

SUMMARY OF THE INVENTION

Embodiments of the present invention provide a precharge circuit of a semiconductor memory apparatus that uses a core voltage and a first supply voltage as precharge power supplies for a pair of local input/output lines so as to reduce the current burden of the core voltage.

According to one embodiment of the present invention, the precharge circuit of a semiconductor memory apparatus includes a first precharge unit and a second precharge unit.

The first precharge unit applies a first core voltage to a pair of local input/output lines, in response to a first precharge signal, to precharge the pair of local input/output lines.

The second precharge unit applies a clamp voltage, which is generated using a first supply voltage, to the pair of local input/output lines, in response to the first precharge signal, to precharge the pair of local input/output lines.

The precharge circuit of a semiconductor memory apparatus according to this embodiment may further include a second core voltage applying unit and an equalizing unit.

The second core voltage applying unit outputs a second precharge signal to the second precharge unit in response to the first precharge signal.

The equalizing unit equalizes the pair of local input/output lines in response to the first precharge signal.

According to another embodiment of the present invention, a precharge circuit of a semiconductor memory apparatus includes a first voltage applying unit and a precharge unit.

The first voltage applying unit outputs a first voltage, which is higher than a target voltage, to be applied to a pair of local input/output lines by a predetermined voltage, in response to a precharge signal.

The precharge unit applies a clamp voltage, generated using a first supply voltage to the pair of local input/output lines in response to the first voltage, so as to precharge the pair of local input/output lines.

The precharge circuit of a semiconductor memory apparatus according to this embodiment may further include an equalizing unit that equalizes the pair of local input/output lines in response to the precharge signal.

According to yet another embodiment of the present invention, a precharge circuit of a semiconductor memory apparatus includes a line and a first clamp unit.

The line receives a first voltage in response to a precharge signal.

The first clamp unit transmits a clamp voltage generated using a first supply voltage to a local input/output line, in response to the first voltage applied to the line.

DESCRIPTION OF EXEMPLARY EMBODIMENT

Embodiments of the present invention will now be described in detail with reference to the accompanying drawings.

Figure 4:
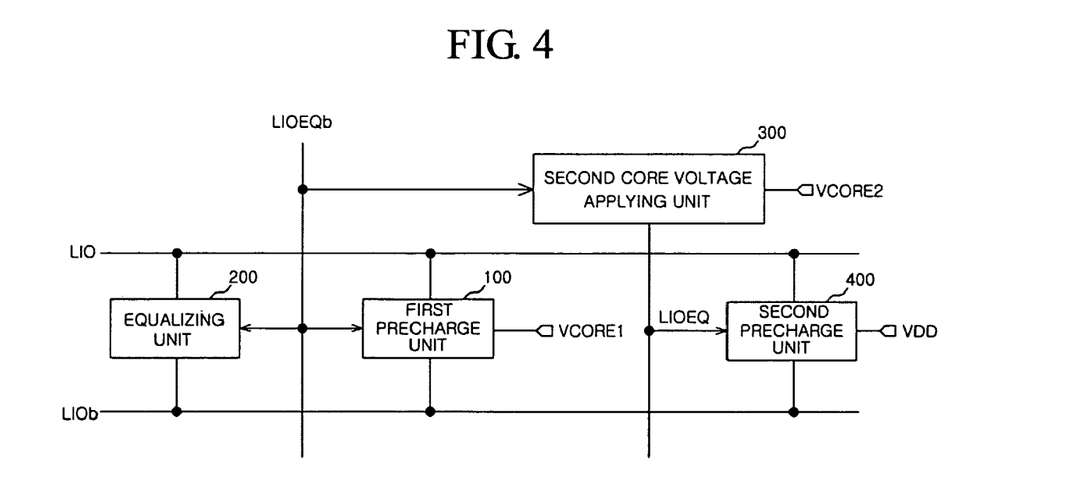
FIG. 4 is a block diagram of a precharge circuit of a semiconductor memory apparatus according to an embodiment of the present invention.

Referring to FIG. 4, the precharge circuit of a semiconductor memory apparatus according to an embodiment of the present invention includes a first precharge unit 100, an equalizing unit 200, a second core voltage applying unit 300 and a second precharge unit 400.

The first precharge unit 100 applies a first core voltage VCORE1 to a pair of local input/output lines LIO and LIOb, in response to a first precharge signal LIOEQb, to precharge the pair of local input/output lines LIO and LIOb.

The equalizing unit 200 equalizes the pair of local input/output lines LIO and LIOb in response to the first precharge signal LIOEQb.

The second core voltage applying unit 300 outputs a second precharge signal LIOEQ in response to the first precharge signal LIOEQb.

The second precharge unit 400 applies a clamp voltage generated using a first supply voltage VDD to the pair of local input/output lines LIO and LIOb, in response to the second precharge signal LIOEQ, to precharge the pair of local input/output lines LIO and LIOb.

The pair of local input/output lines LIO and LIOb comprise of a local input/output line LIO and an inverted local input/output line LIOb that has an inverted level with respect to the level of the local input/output line LIO.

Figure 5:
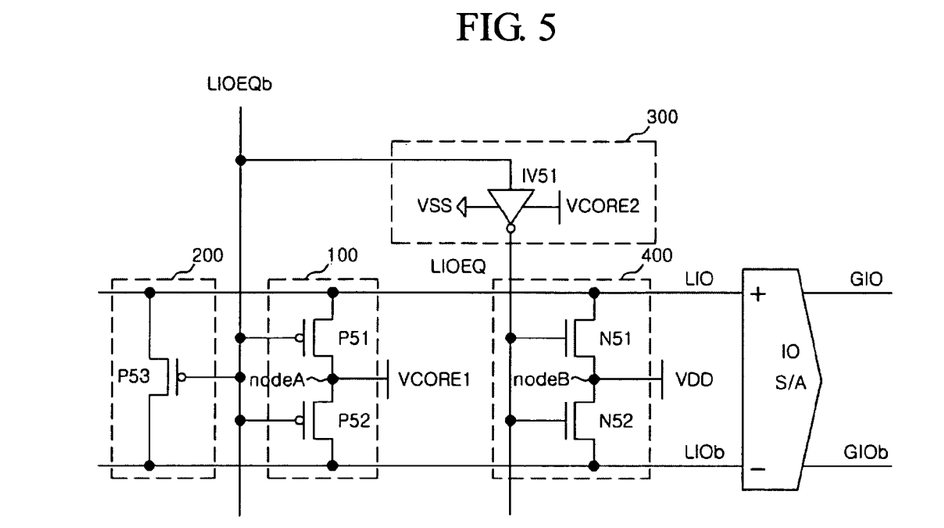
FIG. 5 is a circuit diagram of the precharge circuit shown in FIG. 4.

Referring to FIG. 5, the first precharge unit 100 includes a first PMOS transistor P51 and a second PMOS transistor P52. The first PMOS transistor P51 has a gate terminal that is connected to the first precharge signal LIOEQb and a source and a drain terminal that are coupled between the local input/output line LIO and a first common node nodeA. The second PMOS transistor P52 has a gate terminal that is connected to the first precharge signal LIOEQb, and a source and a drain terminal that are coupled between the first common node nodeA and the inverted local input/output line LIOb.

The equalizing unit 200 includes a third PMOS transistor P53 having a gate terminal that is connected to the first precharge signal LIOEQb and a source and a drain terminal that are coupled between the local input/output line LIO and the inverted local input/output line LIOb.

When the third PMOS transistor P53 is turned on, the local input/output line LIO and the inverted local input/output line LIOb are coupled to each other, thereby performing a precharge operation at high speed.

The second core voltage applying unit 300 may be a circuit that uses a second core voltage VCORE2, which is higher than the first core voltage VCORE1 by a predetermined voltage Vt, as a power supply voltage, and outputs the second precharge signal LIOEQ at the level of the second core voltage VCORE2. In this exemplary embodiment, an inverter IV51 to which the second core voltage VCORE2 is applied is used as the second core voltage applying unit 300.

When the first precharge signal LIOEQb is at a logic low level, the second precharge signal LIOEQ output from the second core voltage applying unit 300 is at the level of the second core voltage VCORE2.

The second precharge unit 400 includes a first NMOS transistor N51 and a second NMOS transistor N52.

The first NMOS transistor N51 has a gate terminal that receives the second precharge signal LIOEQ, a source terminal that is coupled to the local input/output line LIO, and a drain terminal that is coupled to a second common node nodeB.

The second NMOS transistor N52 has a gate terminal that receives the second precharge signal LIOEQ, a drain terminal that is coupled to the second common node nodeB, and a source terminal that is coupled to the inverted local input/output line LIOb.

The first core voltage VCORE1 is an internal voltage having a target level of the first core voltage VCORE1, generated from an external supply voltage VDD by comparing a divided voltage level of the external supply voltage VDD to a first reference voltage VREF1, and used to precharge the pair of local input/output lines LIO and LIOb.

The second core voltage VCORE2 is an internal voltage having a target level of the second core voltage VCORE2, generated from the external supply voltage VDD by comparing the divided voltage level of the external supply voltage VDD to a second reference voltage VREF2, and used to precharge the pair of local input/output lines LIO and LIOb.

The second core voltage VCORE2 may be generated using the second reference voltage VREF2, which is higher than the first reference voltage VREF1 used to generate the first core voltage VCORE1 by ½ of the predetermined voltage Vt.

The first supply voltage VDD may be the external supply voltage VDD, a peripheral circuit voltage VPERI, or a voltage having a level higher than the first core voltage VCORE1.

The predetermined voltage Vt may be a threshold voltage Vt of the NMOS transistors N51 and N52 in the second precharge unit 400.

The first core voltage VCORE1 is applied to the first common node nodeA, and the first supply voltage VDD is applied to the second common node nodeB.

In this embodiment of the present invention, the second precharge unit 400 includes the first NMOS transistor N51 and the second NMOS transistor N52. However, the second precharge unit 400 may include elements for clamping the first supply voltage VDD at the level of the first core voltage VCORE1.

Figure 6:
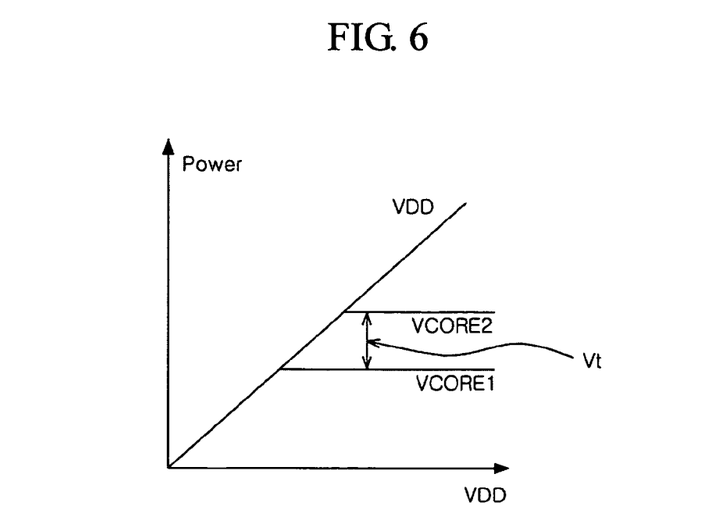
FIG. 6 is a graph illustrating the levels of first and second core voltages.

FIG. 6 is a graph illustrating the levels of the first and second core voltages.

As shown in FIG. 6, the second core voltage VCORE2 applied to the inverter IV51 of the second core voltage applying unit 300 is higher than the first core voltage VCORE1, which precharges the pair of local input/output lines LIO and LIOb, by the predetermined voltage Vt. That is, when the a second precharge signal LIOEQ output from the second core voltage applying unit 300 is at a logic high level, the second precharge signal LIOEQ is at the level of the second core voltage VCORE2.

The operation of the precharge circuit of a semiconductor memory apparatus according to the embodiment of the present invention will now be described with reference to FIGS. 4 to 6.

In the precharge circuit of a semiconductor memory apparatus according to an embodiment of the present invention, the first precharge signal LIOEQb activates the first precharge unit 100, in order to precharge the pair of local input/output lines LIO and LIOb to the level of the first core voltage VCORE1, and the equalizing unit 200, in order to equalize the pair of local input/output lines LIO and LIOb.

Also, the second core voltage applying unit 300, to which the second core voltage VCORE2 has been applied, inverts the first precharge signal LIOEQb and outputs the inverted signal as the second precharge signal LIOEQ.

The second precharge signal LIOEQ activates the second precharge unit 400, and the second precharge unit 400, to which the first supply voltage VDD is applied, precharges the pair of local input/output lines LIO and LIOb to the clamp voltage that is clamped from the first supply voltage VDD.

More specifically, when the first precharge signal LIOEQb is activated at a logic low level, the first PMOS transistor P51 and the second PMOS transistor P52 are turned on. Then, the first core voltage VCORE1 is applied through the first common node nodeA to precharge the pair of local input/output lines LIO and LIOb. The third PMOS transistor P53 is also turned on, equalizing the pair of local input/output lines LIO and LIOb.

The first precharge signal LIOEQb is the input to the second core voltage applying unit 300, where the inverter IV51 of the second core voltage applying unit 300 inverts the first precharge signal LIOEQb in response to the input of the second core voltage VCORE2. As a result, when the first precharge signal LIOEQb is at a logic low level, the second precharge signal LIOEQ output from the second core voltage applying unit 300 has the level of the second core voltage VCORE2.

Also, the second precharge signal LIOEQ, having the level of the second core voltage VCORE2, which is the sum of the first core voltage VCORE1 and the threshold voltage Vt, is connected to the gate terminals of the first and second NMOS transistors N51 and N52 to turn them on.

The first and second NMOS transistors N51 and N52 clamp the first supply voltage VDD at the level of the first core voltage VCORE1 and supply the clamped voltage to the pair of local input/output lines LIO and LIOb in order to precharge them. In this case, the first supply voltage VDD is clamped to a voltage obtained by subtracting the threshold voltage Vt of the first and second NMOS transistors N51 and N52 from the second core voltage VCORE2.

Accordingly, the pair of local input/output lines LIO and LIOb are precharged to the clamped voltage that is generated using the first core voltage VCORE1 and the first supply voltage VDD.

Figure 7:
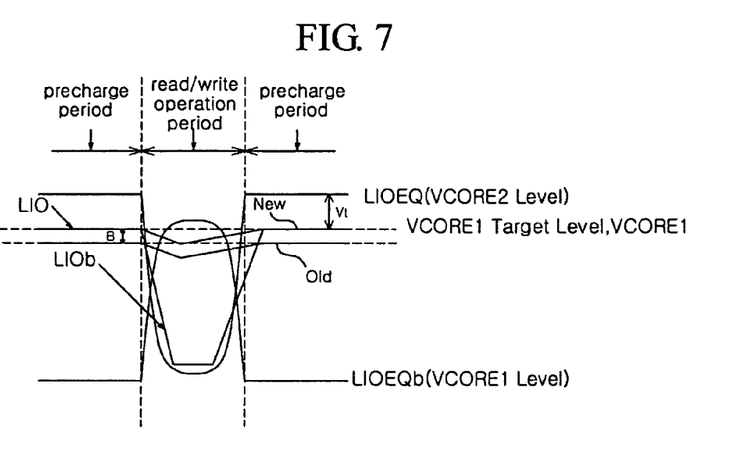
FIG. 7 is a waveform chart illustrating the operation of the precharge circuit shown in FIG. 5.

FIG. 7 depicts a waveform chart illustrating the operation of the precharge circuit shown in FIG. 5.

Referring to FIG. 7, in a precharge period, the first precharge signal LIOEQb is enabled at a logic low level and the second precharge signal LIOEQ is enabled at a logic high level. Accordingly, the first core voltage VCORE1, in response to the first precharge signal LIOEQb, and the first core voltage VCORE1 that is clamped from the first supply voltage VDD, in response to the second precharge signal LIOEQ, are both simultaneously applied to and precharge the pair of local input/output lines LIO and LIOb.

According to an embodiment of the present invention, the clamp voltage that is generated using the first supply voltage VDD and the first core voltage VCORE1 are simultaneously applied to local input/output lines LIO and LIOb, thereby holding the precharged states of the local input/output lines LIO and LIOb at the first core voltage target level.

Also, when the read operation and the write operation are performed in the semiconductor memory apparatus, the first precharge signal LIOEQb is disabled at a logic high level and the second precharge signal LIOEQ is disabled at a logic low level. Therefore the local input/output line LIO and the inverted local input/output line LIOb have different logic levels according to the data.

Figure 8:
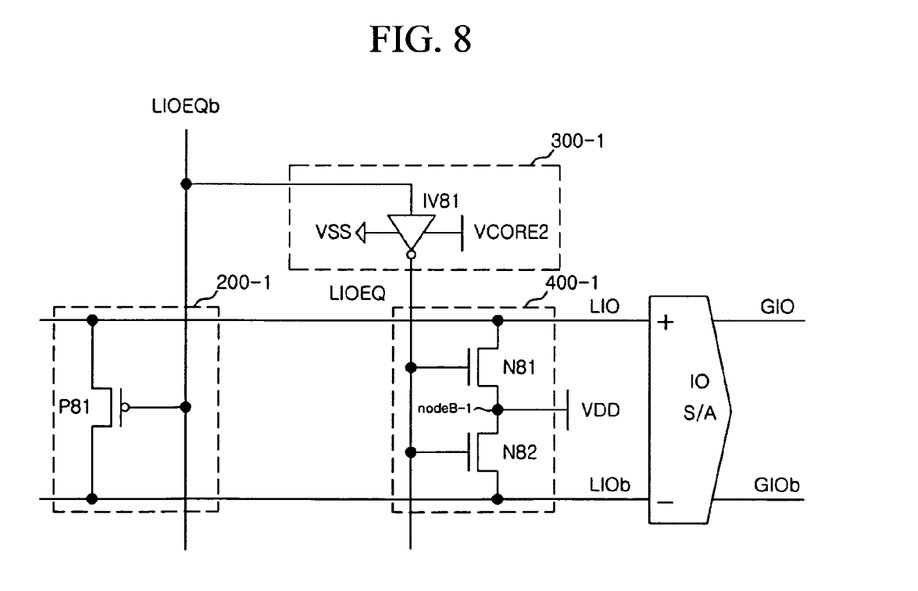
FIG. 8 is a circuit diagram of a precharge circuit of a semiconductor memory apparatus according to another embodiment of the present invention.

FIG. 8 depicts a circuit diagram of a precharge circuit of a semiconductor memory apparatus according to another embodiment of the present invention.

Referring to FIG. 8, the precharge circuit of a semiconductor memory apparatus includes an equalizing unit 200-1, a first voltage applying unit 300-1 and a precharge unit 400-1.

The equalizing unit 200-1 equalizes a pair of local input/output lines LIO and LIOb in response to a first precharge signal LIOEQb. The first voltage applying unit 300-1 outputs a first voltage VCORE2 in response to the first precharge signal LIOEQb. The first voltage VCORE2 is higher than a target voltage to be applied to the pair of local input/output lines LIO and LIOb by a predetermined level. The precharge unit 400-1 applies a clamp voltage that is generated using a first supply voltage VDD to the pair of local input/output lines LIO and LIOb to precharge the pair of local input/output lines LIO and LIOb.

The pair of local input/output lines LIO and LIOb comprises a local input/output line LIO and an inverted local input/output line LIOb that has an inverted level with respect to the level of the local input/output line LIO.

The clamp voltage has the same level as the target voltage. In this embodiment, the level of the target voltage is set to the level of the first core voltage VCORE1.

The equalizing unit 200-1 includes a PMOS transistor P81 having a gate terminal that is connected to the first precharge signal LIOEQb and a source and a drain terminal that are coupled between the local input/output line LIO and the inverted local input/output line LIOb.

When the first PMOS transistor P81 is turned on, the local input/output line LIO and the inverted local input/output line LIOb are coupled to each other, thereby performing a precharge operation at high speed.

The first voltage applying unit 300-1 may be a circuit to which the first voltage VCORE2, which is higher than the clamp voltage by a predetermined level Vt, is applied. The first voltage applying unit 300-1 outputs the first voltage VCORE2 in response to the first precharge signal LIOEQb. In this exemplary embodiment, an inverter IV81, to which the first voltage VCORE2, i.e., the second core voltage VCORE2, is applied, is used as an example of the first voltage applying unit 300-1.

When the first precharge signal LIOEQb is at a logic low level, a second precharge signal LIOEQ output from the first voltage applying unit 300-1 has the level of the second core voltage VCORE2.

The precharge unit 400-1 includes a first NMOS transistor N81 and a second NMOS transistor N82.

The first NMOS transistor N81 has a gate terminal that is connected to the second precharge signal LIOEQ, a source terminal that is coupled to the local input/output line LIO, and a drain terminal that is coupled to a common node nodeB-1.

The second NMOS transistor N82 has a gate terminal that is connected to the second precharge signal LIOEQ, a drain terminal that is coupled to the common node nodeB-1, and a source terminal that is coupled to the inverted local input/output line LIOb.

The first core voltage VCORE1 is an internal voltage having a target level of the first core voltage VCORE1, which is generated from an external supply voltage VDD by comparing a divided voltage level of the external supply voltage VDD to a first reference voltage VREF1, used to precharge the pair of local input/output lines LIO and LIOb.

The second core voltage VCORE2 is an internal voltage having a target level of the second core voltage VCORE2, which is generated from the external supply voltage VDD by comparing the divided voltage level of the external supply voltage VDD to a second reference voltage VREF2, used to precharge the pair of local input/output lines LIO and LIOb.

The second core voltage VCORE2 may be generated using the second reference voltage VREF2, which is higher by ½ of the predetermined voltage Vt than the first reference voltage VREF1 used to generate the first core voltage VCORE1.

The first supply voltage VDD may be the external supply voltage VDD, a peripheral circuit voltage VPERI, or a voltage having a level higher than the first core voltage VCORE1.

The predetermined voltage Vt may be a threshold voltage Vt of the NMOS transistors N81 and N82 provided in the precharge unit 400-1.

The first supply voltage VDD is applied to the common node nodeB-1, and the first supply voltage VDD is higher than the first core voltage VCORE1.

The precharge circuit of a semiconductor memory apparatus according to another embodiment of the present invention will be described below with reference to FIG. 8.

Referring to FIG. 8, in the precharge circuit of a semiconductor memory apparatus the first precharge signal LIOEQb activates the equalizing unit 200-1 to equalize the pair of local input/output lines LIO and LIOb.

The first voltage applying unit 300-1, to which the second core voltage VCORE2 has been applied, inverts the first precharge signal LIOEQb and outputs the inverted signal as the second precharge signal LIOEQ.

The second precharge signal LIOEQ activates the precharge unit 400-1, which applies the clamp voltage, generated by clamping the first supply voltage VDD, to precharge the pair of local input/output lines LIO and LIOb to the level of the first core-voltage VCORE1.

More specifically, when the first precharge signal LIOEQb is activated at a logic low level, the first NMOS transistor N81 is turned on to equalize the pair of local input/output lines LIO and LIOb.

The first precharge signal LIOEQb is the input to the first voltage applying unit 300-1, where the inverter IV81 of the first voltage applying unit 300-1 inverts the first precharge signal LIOEQb in response to the input of the second core voltage VCORE2. Accordingly, when the first precharge signal LIOEQb is at a logic low level, the second precharge signal LIOEQ has the level of the second core voltage VCORE2, which is at the logic high level.

Also, the second precharge signal LIOEQ having the level of the second core voltage VCORE2, which is the sum of the first core voltage VCORE1 and the threshold voltage Vt, is connected to the gate terminals of the first and second NMOS transistors N81 and N82 to turn on the first NMOS transistor N81 and the second NMOS transistor N82.

The first and second NMOS transistors N81 and N82 clamp the first supply voltage VDD at the level of the first core voltage VCORE1 and supply the clamped voltage to precharge the pair of local input/output lines LIO and LIOb. In this case, the first supply voltage VDD is clamped to a voltage obtained by subtracting the threshold voltage Vt of the first and second NMOS transistors N81 and N82 from the second core voltage VCORE2.

Accordingly, the pair of local input/output lines LIO and LIOb are precharged to the clamp voltage that is generated using the first supply voltage VDD.

In the precharge operation according to related art, when current is simultaneously supplied to a plurality of pairs of local input/output lines LIO and LIOb by the first core voltage VCORE1 generated in the semiconductor memory apparatus, the first core voltage VCORE1 drops. However, in this embodiment of the present invention, since the clamp voltage that is generated using the first supply voltage VDD supplied from the outside is applied, the first core voltage VCORE1 does not drop.

As described above, the precharge circuit of a semiconductor memory apparatus according to this embodiment of the present invention either precharges the pair of local input/output lines LIO and LIOb to the clamp voltage clamped from the first supply voltage VDD, or simultaneously precharges the pair of local input/output lines LIO and LIOb to the core voltage VCORE1 and the clamp voltage generated using the first supply voltage VDD. As a result, it is possible to prevent a drop in the first core voltage VCORE1 that occurs when the pair of local input/output lines LIO and LIOb are precharged to only the first core voltage VCORE1, thus ensuring a stable internal operation of the semiconductor memory apparatus, unlike the related art.

The precharge circuit of a semiconductor memory apparatus according to embodiments of present invention simultaneously precharges a pair of local input/output lines to a core voltage and a clamp voltage that is generated using the external supply voltage VDD, thereby reducing an excessive amount of current supplied by the core voltage to ensure a stable operation of the semiconductor memory apparatus.

What is claimed is:

1. A precharge circuit of a semiconductor memory apparatus, comprising:
    a first precharge unit having an input configured to receive a first precharge signal, the first precharge unit being configured to apply a first core voltage to precharge a pair of local input/output lines in response to the first precharge signal
    a second core voltage applying unit having an output configured to output a second core voltage in response to the first precharge signal, wherein the second core voltage is higher than the first core voltage; and
    a second precharge unit having an input configured to receive the second core voltage, the second precharge unit being configured to apply a clamp voltage to precharge the pair of local input/output lines in response to the second core voltage, wherein the clamp voltage is generated by clamping a first supply voltage.

2. The precharge circuit of a semiconductor memory apparatus of claim 1, further comprising:
    an equalizing unit having an input configured to receive the first precharge signal, the equalizing unit being configured to equalize the pair of local input/output lines in response to the first precharge signal.

3. The precharge circuit of a semiconductor memory apparatus of claim 2,
    wherein the pair of local input/output lines comprises a local input/output line and an inverted local input/output line, wherein the logic level of the inverted local input/output line is the inverse of the logic level of the local input/output line.

4. The precharge circuit of a semiconductor memory apparatus of claim 1,
    wherein the first precharge unit comprises:
    a first PMOS transistor having a gate terminal configured to receive the first precharge signal and a source and a drain terminal configured to be coupled between the local input/output line and a common node; and
    a second PMOS transistor having a gate terminal configured to receive the first precharge signal and a source and a drain terminal configured to be coupled between the common node and the inverted local input/output line.

5. The precharge circuit of a semiconductor memory apparatus of claim 2,
    wherein the equalizing unit comprises a switching element configured to coupled between the pair of local input/output lines.

6. The precharge circuit of a semiconductor memory apparatus of claim 1, wherein the second precharge unit comprises first and second clamp elements configured to clamp the first supply voltage in response to the second core voltage.

7. The precharge circuit of a semiconductor memory apparatus of claim 4,
    wherein the first core voltage is applied to the common node.

8. The precharge circuit of a semiconductor memory apparatus of claim 5,
    wherein the switching element comprises a PMOS transistor.

9. The precharge circuit of a semiconductor memory apparatus of claim 6,
    wherein the first clamp element is coupled to the local input/output line and a common node, and the second clamp element is coupled between the common node and the inverted local input/output line.

10. The precharge circuit of a semiconductor memory apparatus of claim 6,
    wherein the second core voltage applying unit comprises an inverter.

11. The precharge circuit of a semiconductor memory apparatus of claim 9,
    wherein the first supply voltage is applied to the common node.

12. The precharge circuit of a semiconductor memory apparatus of claim 11,
    wherein each of the first and second clamp elements comprises an NMOS transistor.

13. The precharge circuit of a semiconductor memory apparatus of claim 12,
    wherein a sum of the first core voltage and a threshold voltage of the NMOS transistor is equal to the second core voltage.

14. The precharge circuit of a semiconductor memory apparatus of claim 13,
    wherein the first supply voltage is an external supply voltage.

15. A precharge circuit of a semiconductor memory apparatus, comprising:
    a first voltage applying unit having an input configured to receive a precharge signal and an output configured to output a first voltage, the first voltage applying unit being configured to output the first voltage in response to the precharge signal, wherein the first voltage is higher than a core voltage by a predetermined voltage, wherein the core voltage is to be applied to a pair of local input/output lines; and
    a precharge unit having an input configured to receive the first voltage, the precharge unit being configured to apply a clamp voltage to precharge the pair of local input/output lines in response to the first voltage, wherein the clamp voltage is generated by clamping a first supply voltage,
    wherein potentials of the core voltage and the clamp voltage are at the same level.

16. The precharge circuit of a semiconductor memory apparatus of claim 15, further comprising:
    an equalizing unit having an input configured to receive the precharge signal, the equalizing unit being configured to equalize the pair of local input/output lines in response to the precharge signal.

17. The precharge circuit of a semiconductor memory apparatus of claim 16,
    wherein the pair of local input/output lines comprises a local input/output line and an inverted local input/output line, wherein the logic level of the inverted local input/output line is the inverse of the logic level of the local input/output line.

18. The precharge circuit of a semiconductor memory apparatus of claim 17,
wherein the equalizing unit further comprises a switching element configured to be coupled between the pair of local input/output lines.

19. The precharge circuit of a semiconductor memory apparatus of claim 17,
wherein the precharge unit comprises first and second clamp elements configured to clamp the first supply voltage in response to the first voltage.

20. The precharge circuit of a semiconductor memory apparatus of claim 18,
wherein the switching element comprises a PMOS transistor.

21. The precharge circuit of a semiconductor memory apparatus of claim 19,
wherein the first clamp element is coupled to the local input/output line and a common node, and the second clamp element is coupled between the common node and the inverted local input/output line.

22. The precharge circuit of a semiconductor memory apparatus of claim 21,
wherein the first voltage applying unit comprises an inverter.

23. The precharge circuit of a semiconductor memory apparatus of claim 21,
wherein the first supply voltage is applied to the common node.

24. The precharge circuit of a semiconductor memory apparatus of claim 23,
wherein each of the first and second clamp elements comprises an NMOS transistor.

25. The precharge circuit of a semiconductor memory apparatus of claim 24,
wherein the NMOS transistor has a threshold voltage equal to the predetermined voltage.

26. The precharge circuit of a semiconductor memory apparatus of claim 25,
wherein the first supply voltage is an external supply voltage.

27. The precharge circuit of a semiconductor memory apparatus of claim 26,
wherein the clamp voltage has a level obtained by subtracting the threshold voltage from the first voltage.

28. A precharge circuit of a semiconductor memory apparatus, comprising:
a line to which a first voltage is applied in response to a precharge signal; and
a first clamp unit configured to transmit a clamp voltage generated using a first supply voltage to a local input/output line in response to the first voltage applied to the lines,
wherein the first voltage is higher than a core voltage by a predetermined voltage, and the core voltage is to be applied to a pair of local input/output lines.

29. The precharge circuit of a semiconductor memory apparatus of claim 28, further comprising:
a second clamp unit configured to respond to the first voltage applied to the line and to be coupled between the first clamp unit and an inverted local input/output line.

30. The precharge circuit of a semiconductor memory apparatus of claim 29,
wherein the first supply voltage is an external supply voltage.

31. The precharge circuit of a semiconductor memory apparatus of claim 30, wherein
the first clamp unit comprises an NMOS transistor having a drain terminal and a source terminal, wherein the first supply voltage is applied to the drain terminal and the source terminal is coupled to the local input/output line; and
the second clamp unit comprises an NMOS transistor having a drain terminal and a source terminal, wherein the first supply voltage is applied to the drain terminal and a source terminal is coupled to the inverted local input/output line.

32. The precharge circuit of a semiconductor memory apparatus of claim 31,
wherein the first voltage has a potential higher than the clamp voltage by a predetermined level.

33. The precharge circuit of a semiconductor memory apparatus of claim 32,
wherein the NMOS transistors have a threshold voltage equal to the predetermined level.

* * * * *